US012648357B2

(12) United States Patent 　 (10) Patent No.: 　 US 12,648,357 B2
Lai 　 (45) Date of Patent: 　 Jun. 2, 2026

(54) VIBRATION MODULE AND METHOD FOR MANUFACTURING THE SAME

(71) Applicant: Darwin Precisions Corporation, Hsinchu County (TW)

(72) Inventor: Yu Jen Lai, Hsinchu County (TW)

(73) Assignee: Darwin Precisions Corporation, Hsinchu County (TW)

( * ) Notice: Subject to any disclaimer, the term of this patent is extended or adjusted under 35 U.S.C. 154(b) by 1018 days.

(21) Appl. No.: 17/719,601

(22) Filed: Apr. 13, 2022

(65) Prior Publication Data

US 2022/0344567 A1 　 Oct. 27, 2022

(30) Foreign Application Priority Data

Apr. 22, 2021 　 (TW) ................................. 110114561

(51) Int. Cl.
H10N 30/20 　 (2023.01)
H10N 30/06 　 (2023.01)
H10N 30/07 　 (2023.01)
H10N 30/87 　 (2023.01)
H10N 30/88 　 (2023.01)

(52) U.S. Cl.
CPC ............. H10N 30/20 (2023.02); H10N 30/06 (2023.02); H10N 30/07 (2023.02); H10N 30/87 (2023.02); H10N 30/88 (2023.02)

(58) Field of Classification Search
CPC ........ H10N 30/20; H10N 30/06; H10N 30/07; H10N 30/87; H10N 30/88; H10N 30/074; H10N 30/704; H10N 30/883; H10N 30/02; G06F 3/041
See application file for complete search history.

(56) References Cited

U.S. PATENT DOCUMENTS

| | | | | |
|---|---|---|---|---|
| 5,163,209 | A | * 11/1992 | Harada | ................... H10N 30/50 |
| | | | | 29/25.35 |
| 9,793,463 | B2 | 10/2017 | Son | |
| 2001/0006714 | A1* | 7/2001 | Bull | ........................ B32B 27/30 |
| | | | | 156/289 |
| 2006/0119226 | A1 | 6/2006 | Nihei | |
| 2009/0271964 | A1 | 11/2009 | Nihei | |
| 2017/0119349 | A1* | 5/2017 | Miyazawa | .......... G01S 7/52082 |
| 2020/0042130 | A1* | 2/2020 | Pragada | ................... H05K 5/06 |
| 2022/0006000 | A1* | 1/2022 | Vella | .................... H10N 30/871 |

FOREIGN PATENT DOCUMENTS

| | | |
|---|---|---|
| CN | 104078559 A | 10/2014 |
| CN | 111403461 A | 7/2020 |

OTHER PUBLICATIONS

CNIPA has issued the Office Action for the corresponding China application on May 29, 2023.

* cited by examiner

*Primary Examiner* — Emily P Pham
(74) *Attorney, Agent, or Firm* — WPAT, PC

(57) ABSTRACT

A vibration module is disclosed. The vibration module includes a film, a piezoelectricity device, and a substrate. The film has a first surface. The piezoelectricity device is disposed on the first surface. The substrate is disposed on the first surface by in-mold injection method, which contacts and surrounds the piezoelectricity device.

5 Claims, 9 Drawing Sheets

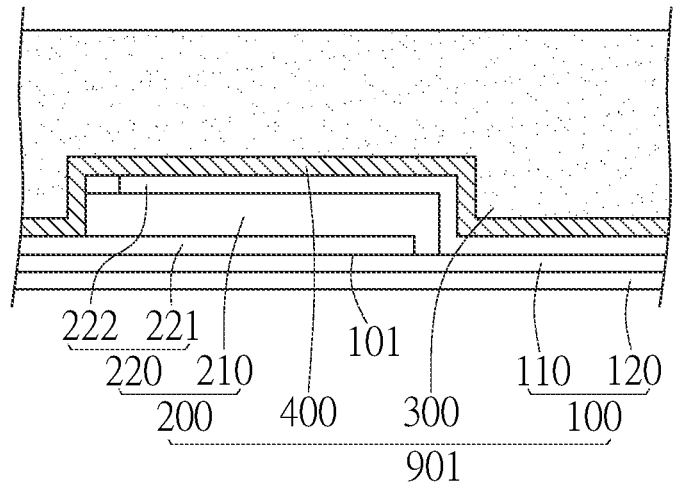
FIG. 2

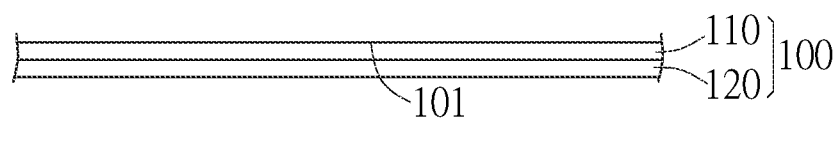
FIG. 4A
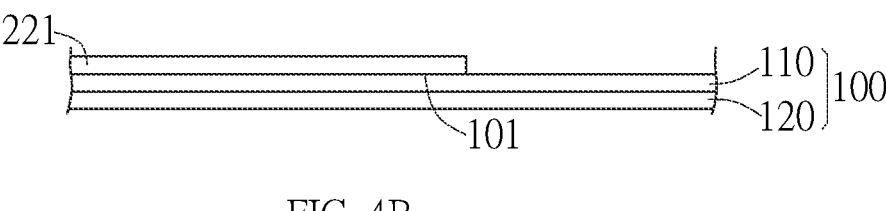
FIG. 4B
FIG. 4C
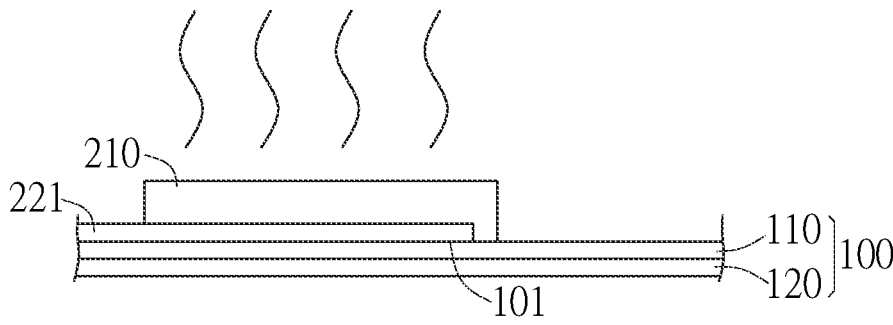
FIG. 4D

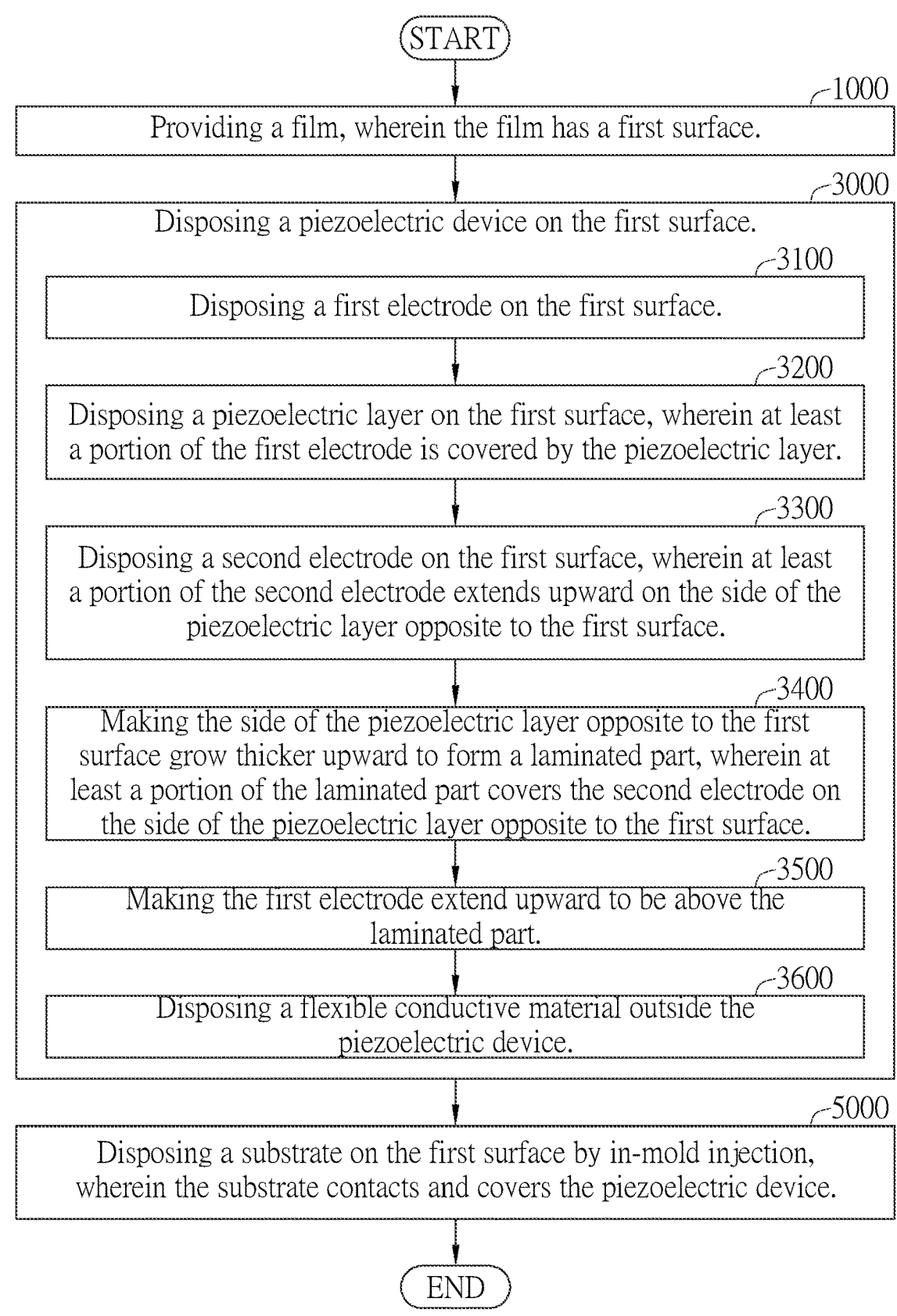

START

1000
Providing a film, wherein the film has a first surface.

3000
Disposing a piezoelectric device on the first surface.

3100
Disposing a first electrode on the first surface.

3200
Disposing a piezoelectric layer on the first surface, wherein at least a portion of the first electrode is covered by the piezoelectric layer.

3300
Disposing a second electrode on the first surface, wherein at least a portion of the second electrode extends upward on the side of the piezoelectric layer opposite to the first surface.

3400
Making the side of the piezoelectric layer opposite to the first surface grow thicker upward to form a laminated part, wherein at least a portion of the laminated part covers the second electrode on the side of the piezoelectric layer opposite to the first surface.

3500
Making the first electrode extend upward to be above the laminated part.

3600
Disposing a flexible conductive material outside the piezoelectric device.

5000
Disposing a substrate on the first surface by in-mold injection, wherein the substrate contacts and covers the piezoelectric device.

END

FIG. 7

VIBRATION MODULE AND METHOD FOR MANUFACTURING THE SAME

BACKGROUND

Technical Field

The present invention relates to a vibration module and a method for manufacturing the same.

RELATED ART

In many electronic devices, there are usually vibration mechanisms disposed to produce vibration. According to the design requirements and the characteristics of the electronic devices, conventional vibration mechanisms disposed in electronic devices often utilize elements such as actuators, piezoelectric materials, electrical field, ultrasonic sound, etc. to produce vibration.

Among the aforesaid options, piezoelectric materials are broadly used in the design of a vibration mechanism. However, applications using the feedback of piezoelectric materials require spring structures for vibration buffering and weight load. It is necessary to design corresponding elastic/damping structures. The design of such a structure is more complicated. Moreover, it is not possible to produce vibration and sensing feedback with respect to accurate positions. Therefore, conventional vibration mechanisms are still improvable.

SUMMARY

One of objectives of the present invention is to provide a vibration module, capable of reducing the amount of elements and increasing the accuracy of feedback position.

One of objectives of the present invention is to provide a vibration module manufacturing method, capable of simplifying the manufacturing process and decreasing the cost.

The vibration module of the present invention includes a film, a piezoelectric device, and a substrate. The film has a first surface. The piezoelectric device is disposed on the first surface. The substrate is disposed on the first surface by in-mold injection, wherein the substrate contacts and covers the piezoelectric device.

The vibration module manufacturing method of the present invention includes providing a film having a first surface; disposing a piezoelectric device on the first surface; and disposing a substrate on the first surface by in-mold injection, wherein the substrate contacts and covers the piezoelectric device.

BRIEF DESCRIPTION OF THE DRAWINGS

FIG. 2 is a top view of another embodiment of a vibration module according to the present invention.

FIGS. 4A to 4G are schematic diagrams of an embodiment of manufacturing a vibration module by a vibration module manufacturing method according to the present invention.

FIG. 7 is a schematic flowchart of another embodiment of a vibration module manufacturing method according to the present invention.

DETAILED DESCRIPTION

Figure 1A:
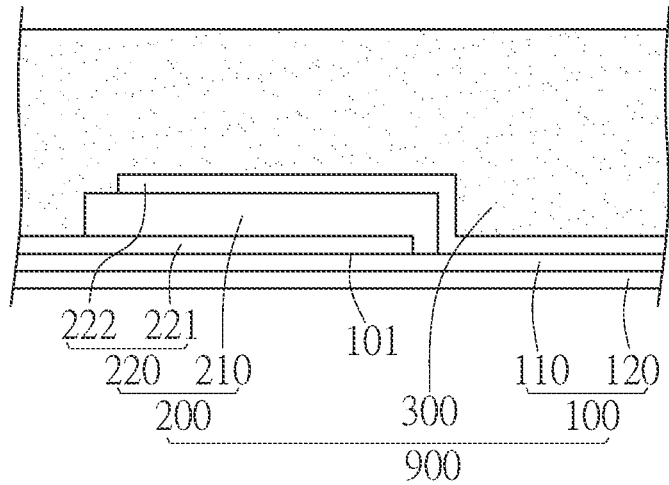
FIG. 1A is a schematic diagram of an embodiment of a vibration module according to the present invention.

Implementations of a connection assembly disclosed by the present invention are described below by using particular and specific embodiments with reference to the drawings, and a person skilled in the art may learn of advantages and effects of the present invention from the disclosure of this specification. However, the following disclosure is not intended to limit the protection scope of the present invention, and a person skilled in the art may carry out the present invention by using other different embodiments based on different viewpoints without departing from the concept and spirit of the present invention. In the accompanying drawings, plate thicknesses of layers, films, panels, regions, and the like are enlarged for clarity. Throughout the specification, same reference numerals indicate same elements. It should be understood that when an element such as a layer, film, region or substrate is referred to as being "on" or "connected" to another element, it may be directly on or connected to the another element, or intervening elements may also be present. In contrast, when an element is referred to as being "directly on" or "directly connected to" another element, there is no intervening element present. As used herein, "connection" may refer to a physical and/or electrical connection. Further, "electrical connecting" or "coupling" may indicate that another element exists between two elements.

It should be noted that the terms "first", "second", "third", and the like that are used in the present disclosure can be used for describing various elements, components, regions, layers and/or portions, but the elements, components, regions, layers and/or portions are not limited by the terms. The terms are merely used to distinguish one element, component, region, layer, or portion from another element, component, region, layer, or portion. Therefore, the "first element", "component", "region", "layer", or "portion" discussed below may be referred to as a second element, component, region, layer, or portion without departing from the teaching of this disclosure.

In addition, relative terms, such as "down" or "bottom" and "up" or "top", are used to describe a relationship between an element and another element, as shown in the figures. It should be understood that the relative terms are intended to include different orientations of a device in addition to orientations shown in the figures. For example, if a device in a figure is turned over, an element that is described to be on a "lower" side of another element is directed to be on an "upper" side another element. Therefore, the exemplary terms "down" may include orientations of "down" and "up" and depends on a particular orientation of an accompanying drawing. Similarly, if a device in a figure is turned over, an element that is described as an element "below" another element or an element "below" is directed to be "above" another element. Therefore, the exemplary terms "below" or "below" may include orientations of up and down.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Figure 1B:
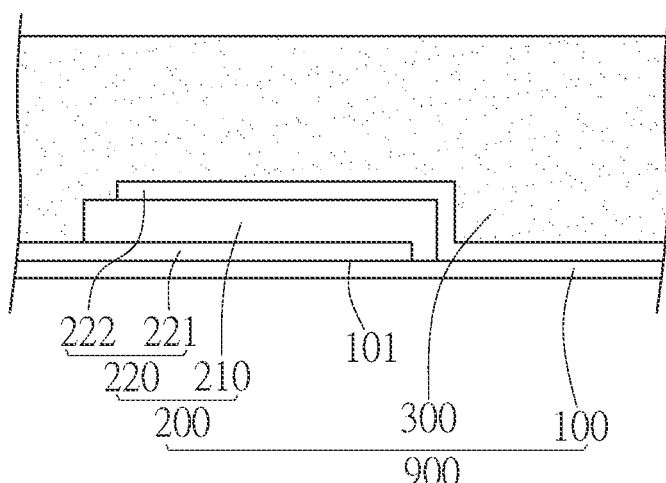
FIG. 1B is a schematic diagram of another embodiment of a vibration module according to the present invention.

As shown in the embodiment in FIG. 1A, the vibration module 900 of the present invention includes a film 100, a piezoelectric device 200, and a substrate 300. The film 100 has a first surface 101. The film 100 can be flexible due to its material or thickness. More particularly, the film 100 can be made of materials such as elastic polymers or rubbers, or metal and metallic oxide with ultra-thin thickness. In an embodiment, the film 100 includes a pattern layer 100 and a translucent layer 120, wherein the thickness of the film 100 is 0.1 mm to 0.25 mm. The pattern layer 110 has a first surface 101. The translucent layer 120 is disposed on the side of the pattern layer 110 opposite to the first surface 101. More particularly, for example, the film 100 can be cover films for the control panels of home appliances. The translucent layer 120 can be translucent flexible polymer films. The pattern layer 110 can be layers having patterns disposed on the translucent layer 120 by means of methods such as printing, wherein the pattern layer 110 and a user are on the two opposite sides of the translucent layer 120. Accordingly, eyes 800 of the user can see the patterns of the pattern layer 110 through the translucent layer 120, wherein the patterns of the pattern layer 110 can be protected from damaging by the translucent layer 120. In different embodiments, according to the requirements for simplifying manufacturing processes or enhancing visual effects, the film 100 can be a single film or laminated films with more than two layers of pattern. Moreover, as shown in the embodiment in FIG. 1B, for light tight applications, the film 100 can be films made of non-transparent materials.

As shown in the embodiment in FIG. 1A, the piezoelectric device 200 is disposed on the first surface 101. More particularly, the piezoelectric device 200 includes a piezoelectric layer 210 and a circuit layer 220. The piezoelectric layer 210 can be made of piezoelectric materials such as crystalline materials, ceramics, polymers, composite piezoelectric materials, etc. The circuit layer 200 includes electrodes respectively connected to the upper and lower sides of the piezoelectric layer 210. Specifically, as shown in the embodiment in FIG. 1A, the circuit layer 220 includes a first electrode 221 and a second electrode 222. The first electrode 221 is disposed on the first surface 101, wherein at least a portion of the first electrode 221 is covered by the piezoelectric layer 221. One can first dispose the first electrode 221 on the first surface 101 and then dispose the piezoelectric layer 210 to make the piezoelectric layer 210 disposed on the first surface 101 as well as on the first electrode 221. A portion of the second electrode 222 is disposed on the first surface 101, wherein at least a portion of the second electrode 222 extends to the side of the piezoelectric layer 210 opposite to the first surface 101 to actuate the piezoelectric layer 210 with the first electrode 221 or collect the electron charges on the surface corresponding to the piezoelectric layer 210.

The first electrode 221 and the second electrode 222 preferably cover the piezoelectric layer 210 by the largest possible area to maximize the piezoelectric effect. However, to avoid shorting between the first electrode 221 and the second electrode 222 in the manufacturing process and during use, the contours of the first electrode 221 and the second electrode 222 recede 0.5-3.5 mm with respect to the contour of the piezoelectric layer 210. In other words, the vertical projections of the first electrode 221 and the second electrode 222 on the first surface 101 recede 0.5-3.5 mm with respect to the vertical projections of the piezoelectric layer 210 on the first surface 101. Accordingly, the first electrode 221 and the second electrode 222 are isolated by the piezoelectric layer 210. In an embodiment, extendable elastic conductive silver paste can be used as the first electrode 221 and the second electrode 222 to increase extensibility.

As shown in the embodiment in FIG. 1A, the substrate 300 is disposed on the first surface 101 by in-mold injection, wherein the substrate 300 contacts and covers the piezoelectric device 200. Subject to the limit of moldability of the injection molding, the substrate 300 and the film 100 can be any design having a curved surface and is not limited to planar applications. Since the substrate 300 is disposed by in-mold injection, the substrate 300 attaches to the first surface 101 and the surface of the piezoelectric device 200 on the first surface 101. Specifically, one side of the piezoelectric device 200 is the film 100 and the other side of the same is the substrate 300. Since the film 100 is flexible and the substrate 300 is more rigid, by applying an electric field (electric voltage) on the surface of the piezoelectric layer 210 via the first electrode 221 and the second electrode 222, deformation of the piezoelectric layer 210 can be produced by inverse piezoelectric effect, wherein more significant vibration can be produced on the film 100 side. On the other hand, when applying physical pressure on the film 100 side, equal amount of positive and negative charges would be produced on the surface corresponding to the piezoelectric layer 210 by piezoelectric effect, generating a touch signal.

Based on the above-mentioned, the main structure of the vibration module 900 of the present invention includes the film 100, the piezoelectric device 200 and the substrate 300, and doesn't include elastic/damping structures. Hence, the number of elements used can be reduced. On the other hand, since the feedback position of vibration/sensing corresponds to the position of the piezoelectric device 200, the accuracy of feedback position can be increased. Specifically, a plurality of piezoelectric devices 200 can be disposed between the film 100 and the substrate 300, the position of each piezoelectric device 200 corresponds to a position on the film 100. Therefore, the vibration/sensing at specific positions can be carried out.

As shown in the embodiment in FIG. 2A, the vibration module 901 of the present invention further includes a protecting layer 400 disposed between the substrate 300 and the piezoelectric device 200. The melting point of the piezoelectric layer 210 is generally around 150° C. The melting point of the protecting layer 400 is higher than 150° C. The hardness of the protecting layer 400 is higher than 2H. It must be transparent in transparent applications. The protecting layer 400 and the substrate 300 should be combinable, i.e., compatible with each other, to ensure the reliability of the product. The thermal expansion coefficient of the protecting layer 400 and the thermal expansion coefficient of the substrate 300 should be close, e.g., the difference between the two is less than 40%. Accordingly, the piezoelectric layer 210 can be protected while disposing the substrate 300 by in-mold injection, i.e., to prevent damage caused by high temperature and high pressure. Moreover, the stickiness and reliability of interface adherence can be increased. The oxidation in the manufacturing process and the electrical property variation caused by moisture can be prevented. In different embodiments, while disposing the substrate 300 by in-mold injection, the protecting layer 400 can be decomposed or mixed with the substrate 300. As such, the substrate 300 includes the material of the protecting layer 400.

Figure 3:
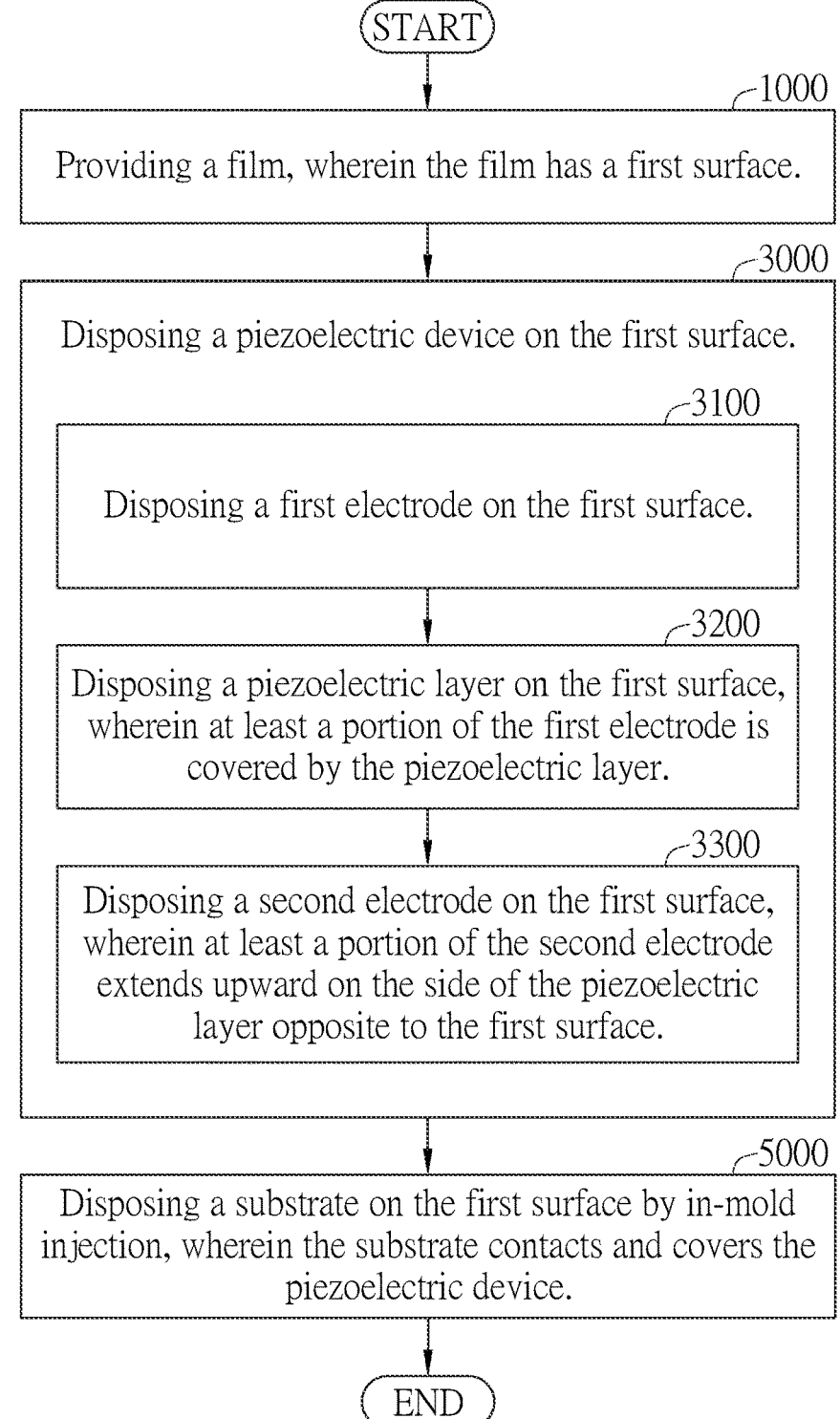
FIG. 3 is a schematic flowchart of an embodiment of a vibration module manufacturing method according to the present invention.

As shown in the flowchart of an embodiment shown in FIG. 3, a vibration module manufacturing method according to the present invention includes, for example, the following steps.

Figure 4E:
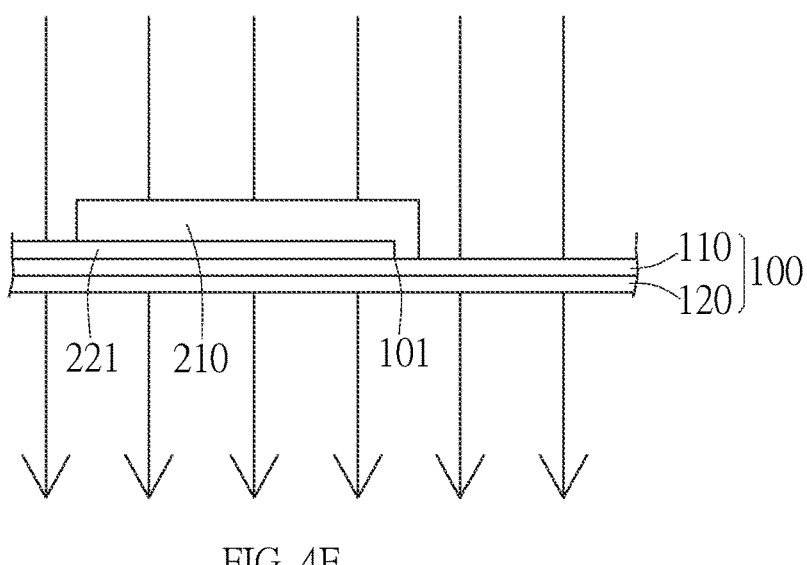
Figure 4F:
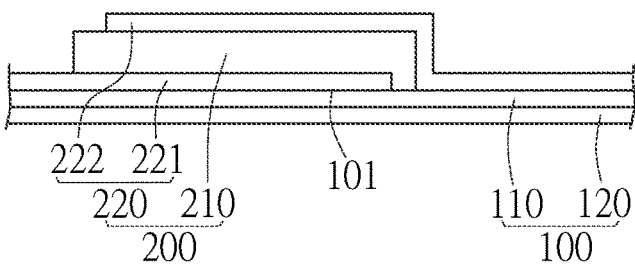

Step 1000: providing a film, wherein the film has a first surface. For example, as shown in the embodiment in FIG. 4A, providing a flexible film 100, wherein the film 100 includes a pattern layer 110 and a translucent layer 120. The pattern layer 110 has a first surface 101. The translucent layer 120 is disposed on the side of the pattern layer 110 opposite to the first surface 101. More particularly, the translucent layer 120 can be translucent flexible polymer films. The pattern layer 110 can be layers having patterns disposed on the translucent layer 120 by means of methods such as printing. In other words, the step of providing the film 100 could include providing the translucent layer 120 and forming the pattern layer 110 on one face of the translucent layer 120, wherein the first surface 101 is disposed on the side of the pattern layer 110 opposite to the translucent layer 120. In different embodiments, according to the requirements of simplifying the manufacturing process or increasing the visual effect, the film 100 can be a single film or laminated films with more than two layers having patterns. For light-tight applications, the film 100 can be films made of non-transparent materials.

Step 3000: disposing a piezoelectric device on the first surface. For example, as shown in the embodiment in FIGS. 4B to 4F, disposing a piezoelectric device on the first surface 101. More particularly, step 3000 includes, for example, the following steps.

Step: 3100: disposing a first electrode on the first surface. For example, as shown in the embodiment in FIG. 4B, disposing a first electrode 221 on the first surface 101 by printing or deposition. The first electrode 221 can be metals such as gold, silver, copper, or non-metallic conductors such as indium tin oxide, or polymer conductors (e.g. poly(3,4-ethylenedioxythiophene) polystyrene sulfonate). The printing can be accomplished by, for example, screen printing. The deposition can be accomplished by physical vapor deposition, e.g., sputtering, and/or chemical vapor deposition.

Step: 3200: disposing a piezoelectric layer on the first surface, wherein at least a portion of the first electrode is covered by the piezoelectric layer. For example, as shown in the embodiment in FIG. 4C, disposing a piezoelectric layer 210 on the first surface 101, wherein at least a portion of the first electrode 221 is covered by the piezoelectric layer 210. The piezoelectric layer 210 can be made of piezoelectric materials such as crystalline materials, ceramics, polymers, composite piezoelectric materials, etc. The deposition can be accomplished by physical vapor deposition, e.g., sputtering, and/or chemical vapor deposition. After forming the piezoelectric layer 210, as shown in the embodiment in FIGS. 4D and 4F, the annealing process and polarizing process can be carried out. The annealing process refers to putting the piezoelectric layer 210 in an environment with a temperature in the range around 120 to 140° C. for a period of time to homogenize the material of the piezoelectric layer 210 and ensuring the performance of the piezoelectric characteristic. The polarizing process refers to putting the piezoelectric layer 210 in an environment with an electric field in the intensity range around 50 to 100 V/um for a period of time to make the dipole moment direction in the material of the piezoelectric layer 210 uniform and produce piezoelectric characteristic.

Step: 3300: disposing a second electrode on the first surface, wherein at least a portion of the second electrode extends upward on the side of the piezoelectric layer opposite to the first surface. For example, as shown in the embodiment in FIG. 4F, a second electrode 222 is disposed on the first surface 101 by printing or deposition, wherein at least a portion of the second electrode 222 extends upward on the side of the piezoelectric layer 210 opposite to the first surface 101. The second electrode 222 can be metals such as gold, silver, copper, or non-metallic conductors such as indium tin oxide, or polymer conductors (e.g. poly(3,4-ethylenedioxythiophene) polystyrene sulfonate). The printing can be accomplished by, for example, screen printing. The deposition can be accomplished by physical vapor deposition, e.g., sputtering, and/or chemical vapor deposition. During deposition, the second electrode 222 is substantially formed on the first surface 101, on the top and one side of the piezoelectric layer 210 at the same time.

Figure 4G:
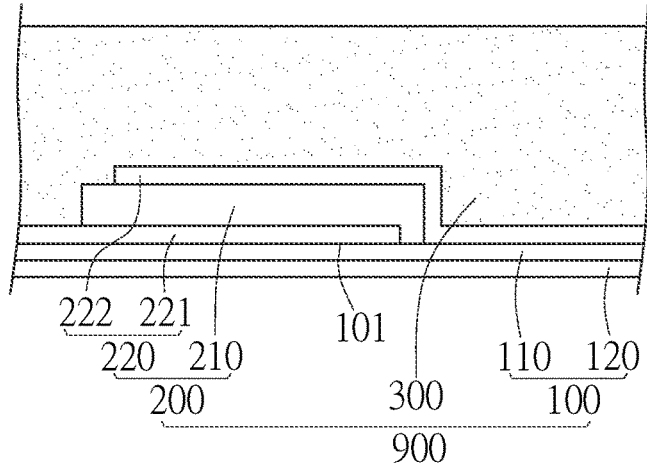

Step 5000: disposing a substrate on the first surface by in-mold injection, wherein the substrate contacts and covers the piezoelectric device. For example, as shown in the embodiment in FIG. 4G, disposing a substrate 300 by in-mold injection to make one side of the substrate 300 attach to the surface of the piezoelectric device 200 and the first surface 101 not covered by the piezoelectric device 200.

Figure 5:
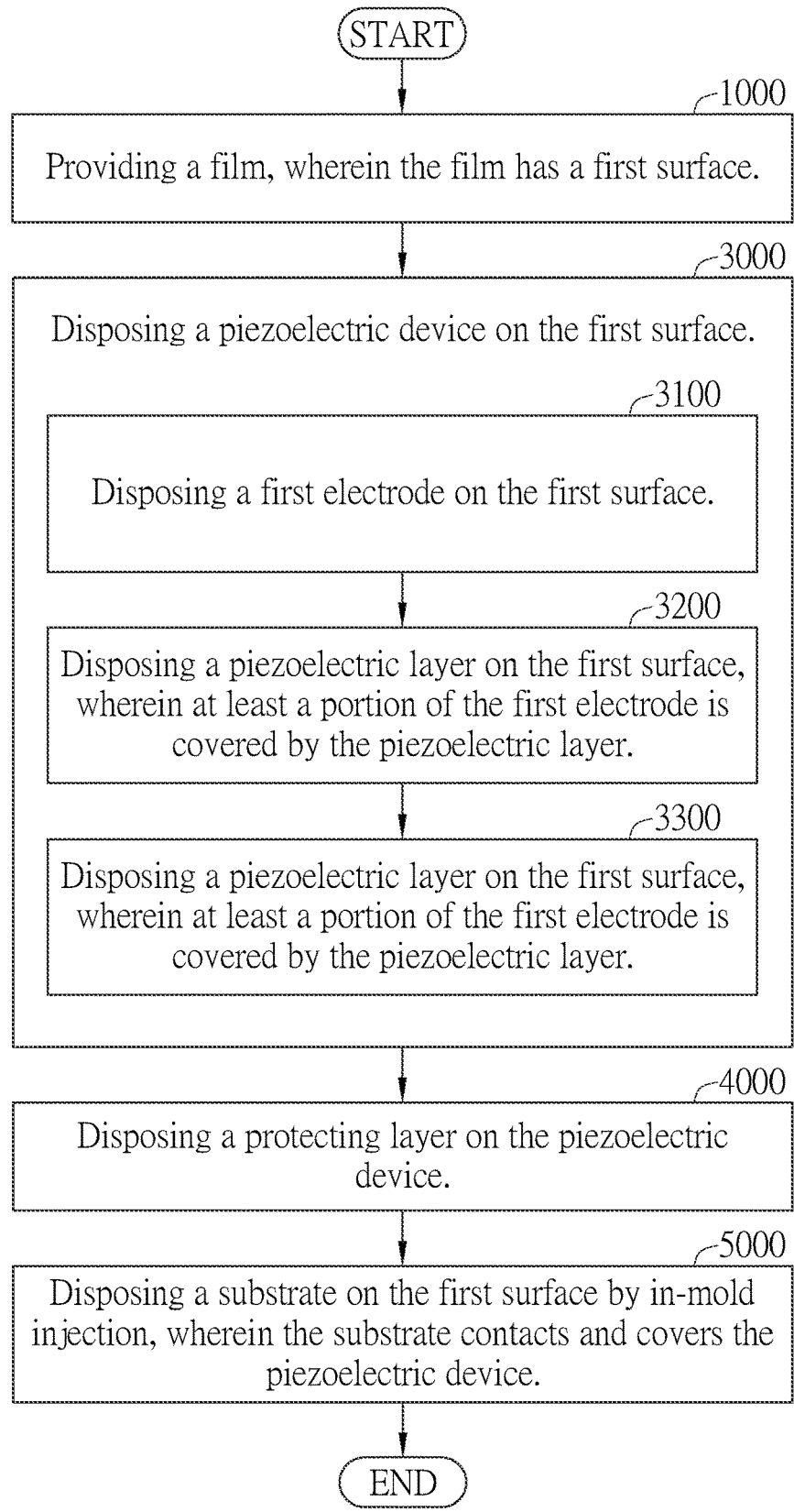
FIG. 5 is a schematic flowchart of another embodiment of a vibration module manufacturing method according to the present invention.
Figure 6A:
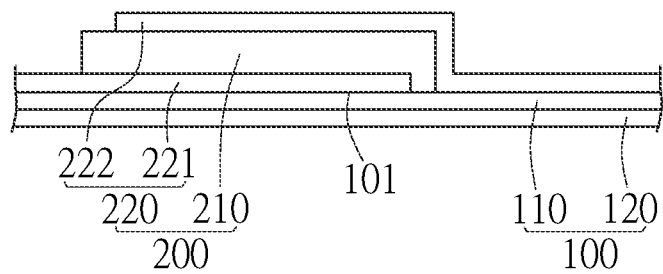
FIGS. 6A to 6B are schematic diagrams of another embodiment of manufacturing a vibration module by a vibration module manufacturing method according to the present invention.
Figure 6B:
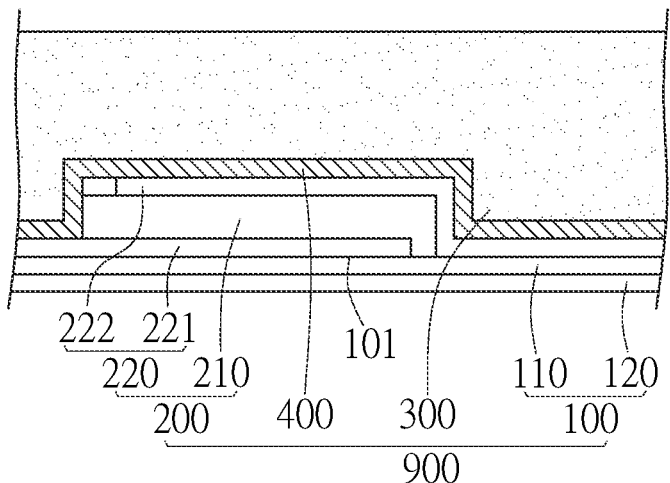

As shown in the flowchart of a different embodiment shown in FIG. 5, the vibration module manufacturing method according to the present invention further includes, between the step of disposing the piezoelectric device and the step of in-mold injection (i.e., step 3000 and step 5000), step 4000: disposing a protecting layer on the piezoelectric device. For example, as shown in the embodiment in FIG. 6A, disposing a protecting layer 400 on the piezoelectric device 200 by printing, injection printing, or deposition. The melting point of the protecting layer 400 is higher than 150° C. The hardness of the protecting layer 400 is higher than 2H. The printing can be accomplished by, for example, screen printing. The deposition can be accomplished by physical vapor deposition, e.g., sputtering, and/or chemical vapor deposition. As shown in the embodiment in FIG. 6B, the substrate 300 is disposed on the first surface 101 by in-mold injection, wherein the substrate 300 contacts and covers the protecting layer 400 and the piezoelectric device 200. In other words, one side of the substrate 300 attaches to the protecting layer 400 and the first surface 101 not covered by the protecting layer 400.

Figure 8A:
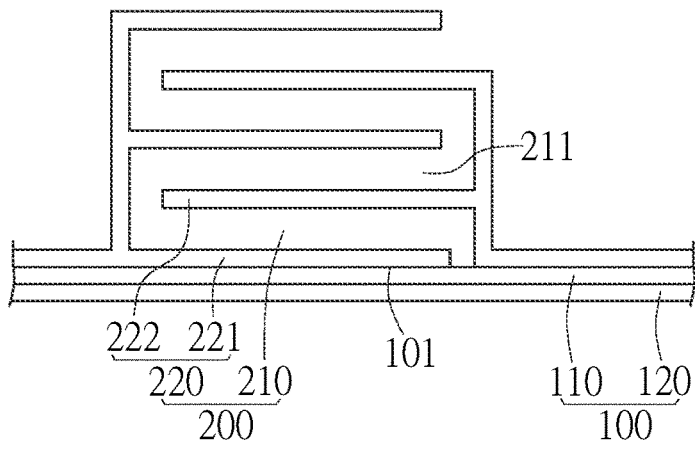
FIGS. 8A to 8C are schematic diagrams of another embodiment of manufacturing a vibration module by a vibration module manufacturing method according to the present invention.

In different embodiments, the piezoelectric device can be disposed in lamination to increase vibration feedback. More particularly, as shown in the flowchart of a different embodiment shown in FIG. 7, the vibration module manufacturing method according to the present invention further includes, after the step of disposing the second electrode (i.e. step 3300), step 3400: making the side of the piezoelectric layer opposite to the first surface grow thicker upward to form a laminated part, wherein at least a portion of the laminated part covers the second electrode on the side of the piezo-electric layer opposite to the first surface; and step 3500: making the first electrode extend upward to be above the laminated part. For example, as shown in the embodiment in FIG. 8A, making the side of the piezoelectric layer 210 opposite to the first surface 101 grow thicker upward to form a laminated part 211. At least a portion of the laminated part 211 covers the second electrode 222 on the side of the piezoelectric layer 210 opposite to the first surface 101, which makes the first electrode 221 extend upward to be above the laminated part 211. The printing can be accomplished by, for example, screen printing. The deposition can be accomplished by physical vapor deposition, e.g., sputtering, and/or chemical vapor deposition. In other words, it repeats the steps of disposing the piezoelectric layers and the electrodes to dispose the piezoelectric device in lamination.

Figure 8B:
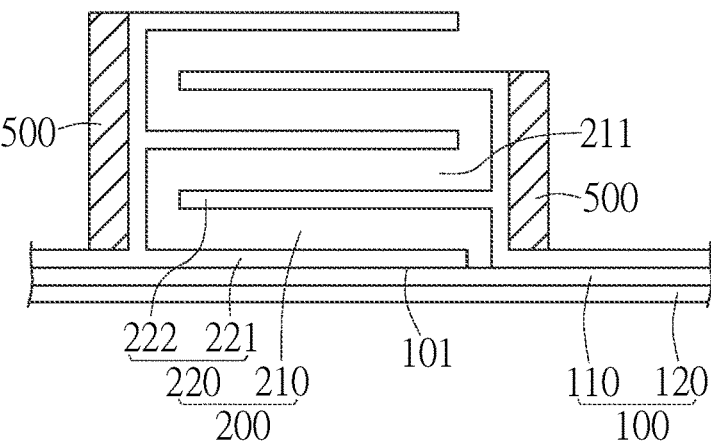
Figure 8C:
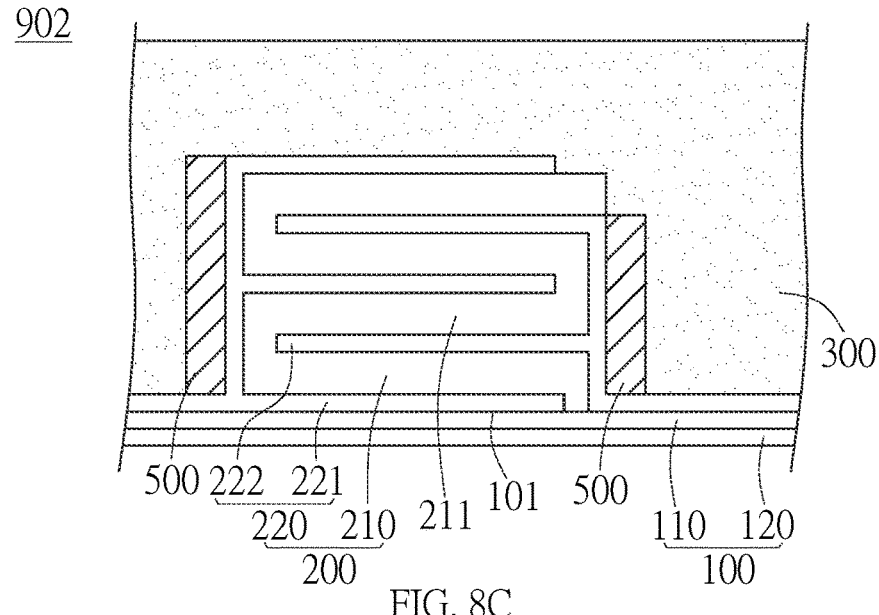

As shown in the flowchart of a different embodiment shown in FIG. 7, the vibration module manufacturing method according to the present invention further includes, after the step of making the first electrode extend upward to be above the laminated part (i.e. step 3500), step 3600: disposing a flexible conductive material outside the piezoelectric device. For example, as shown in the embodiment in FIG. 8B, disposing a flexible conductive material 500 outside the piezoelectric device 200 by printing or deposition. The flexible conductive material 500 can be extendable elastic conductive silver paste, wherein the electrical conduction between the laminated structures is ensured by its extensibility. As shown in the embodiment in FIG. 8C, the substrate 300 is disposed on the first surface 101 by in-mold injection, wherein the substrate 300 contacts and covers the piezoelectric device 200 and the flexible conductive material 500. In other words, one side of the substrate 300 attaches to the piezoelectric device 200 and the flexible conductive material 500, as well as the first surface 101 not covered by the piezoelectric device 200 and the flexible conductive material 500.

The present invention is described by means of the above-described relevant embodiments. However, the above-described embodiments are only examples for implementing the present invention. It should be pointed out that the disclosed embodiments do not limit the scope of the present invention. In contrast, the spirit included in the scope of the patent application and modifications and equivalent settings made within the scope are all included in the scope of the present invention.

What is claimed is:

1. A vibration module, comprising:
   a film having a first surface;
   a piezoelectric device disposed on the first surface; and
   a substrate disposed on the first surface by in-mold injection, wherein the substrate contacts and covers the piezoelectric device;
   wherein the piezoelectric device includes:
      a first electrode including a plurality of first electrode layers coupled with each other, wherein the plurality of first electrode layers are laminated on the first surface;
      a second electrode including a connecting layer and a plurality of second electrode layers coupled with each other, wherein the connecting layer is disposed on the first surface, each of the plurality of second electrode layers is disposed between two of the plurality of first electrode layers; and
      a piezoelectric layer disposed between the first electrode layer, the second electrode layer, and the first surface.

2. The vibration module according to claim 1, wherein the film includes:
   a pattern layer having the first surface; and
   a translucent layer disposed on a side of the pattern layer opposite to the first surface.

3. The vibration module according to claim 1, further comprising a protecting layer disposed between the substrate and the piezoelectric device.

4. The vibration module according to claim 3, wherein a melting point of the protecting layer is higher than 150° C., a difference between a thermal expansion coefficient of the protecting layer and a thermal expansion coefficient of the substrate is less than 40%, the protecting layer and the substrate are compatible with each other.

5. The vibration module according to claim 3, wherein the substrate includes a material of the protecting layer.

* * * * *